United States Patent
Lee et al.

(10) Patent No.: US 10,347,487 B2
(45) Date of Patent: Jul. 9, 2019

(54) CELL CONTACT

(71) Applicant: Micron Technology, Inc., Boise, ID (US)

(72) Inventors: Che-Chi Lee, Boise, ID (US); Hiromitsu Oshima, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 15/812,274

(22) Filed: Nov. 14, 2017

(65) Prior Publication Data

US 2019/0148136 A1    May 16, 2019

(51) Int. Cl.
| | |
|---|---|
| *H01L 21/02* | (2006.01) |
| *H01L 21/027* | (2006.01) |
| *H01L 21/768* | (2006.01) |
| *H01L 23/522* | (2006.01) |
| *H01L 23/532* | (2006.01) |
| *H01L 23/528* | (2006.01) |

(52) U.S. Cl.
CPC .... *H01L 21/0276* (2013.01); *H01L 21/76816* (2013.01); *H01L 21/76877* (2013.01); *H01L 23/528* (2013.01); *H01L 23/5226* (2013.01); *H01L 23/5329* (2013.01)

(58) Field of Classification Search
CPC .... H01L 23/58; H01L 23/528; H01L 21/0276
See application file for complete search history.

(56) References Cited

U.S. PATENT DOCUMENTS

| | | | | |
|---|---|---|---|---|
| 2006/0071301 A1* | 4/2006 | Luo | ......................... | G03F 7/091 257/632 |
| 2006/0273456 A1* | 12/2006 | Sant | ..................... | H01L 21/3086 257/734 |
| 2007/0048674 A1* | 3/2007 | Wells | ..................... | H01L 27/101 430/313 |
| 2007/0049032 A1* | 3/2007 | Abatchev | ............ | H01L 21/0337 438/691 |
| 2007/0049035 A1* | 3/2007 | Tran | ..................... | H01L 21/0337 438/696 |
| 2008/0188080 A1 | 8/2008 | Furukawa et al. | | |
| 2010/0246062 A1* | 9/2010 | Albrecht | ................ | B82Y 10/00 360/131 |
| 2013/0092993 A1* | 4/2013 | Hijioka | ................ | H01L 27/0207 257/301 |

\* cited by examiner

*Primary Examiner* — Caridad Everhart
*Assistant Examiner* — Ankush K Singal
(74) *Attorney, Agent, or Firm* — Schwegman Lundberg & Woessner, P.A.

(57) ABSTRACT

Apparatus and methods of forming an apparatus can include one or more cell contacts in an integrated circuit in a variety of applications. In various embodiments, a resist underlayer can be formed on a dielectric spacer formed on a structure for a cell contact, where the structure can include a patterned area of pillars on a silicon-rich dielectric anti-reflective coating region disposed on a dielectric region. The resist underlayer, the dielectric spacer, the patterned area of pillars, the silicon-rich dielectric anti-reflective coating, and the dielectric region can be processed to form an array of columns in the dielectric region. Regions between the columns of the array of columns can be filled with conductive material, forming the cell contact. Additional apparatus, systems, and methods are disclosed.

23 Claims, 10 Drawing Sheets

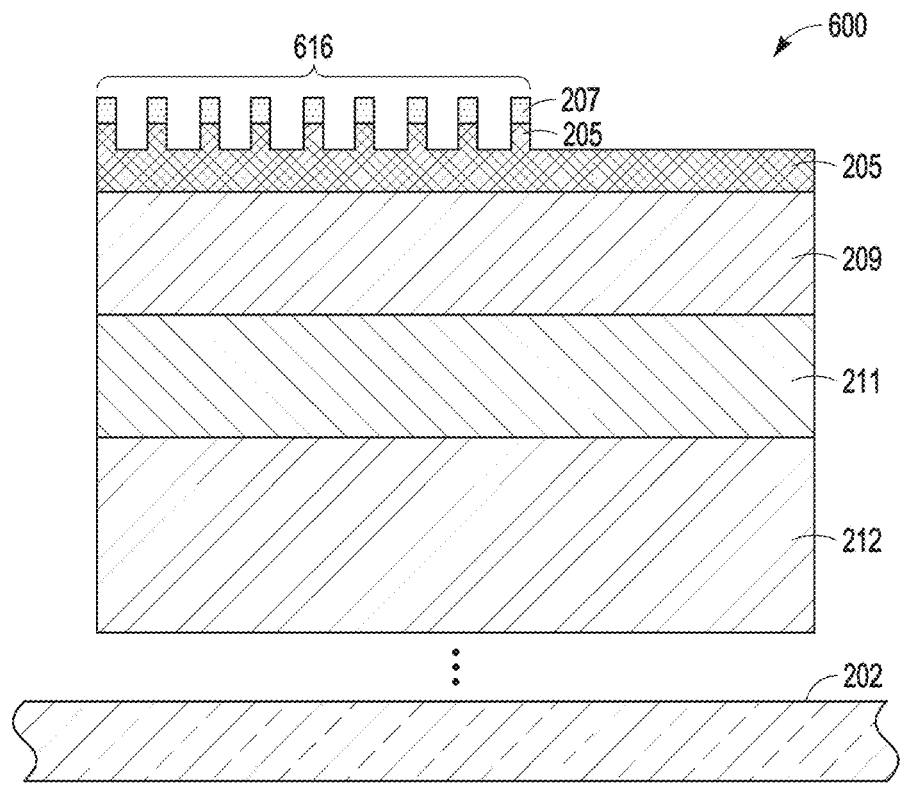
FIG. 6
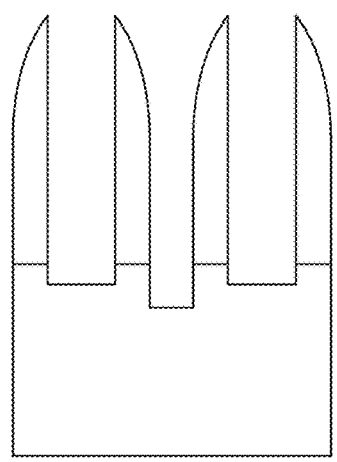 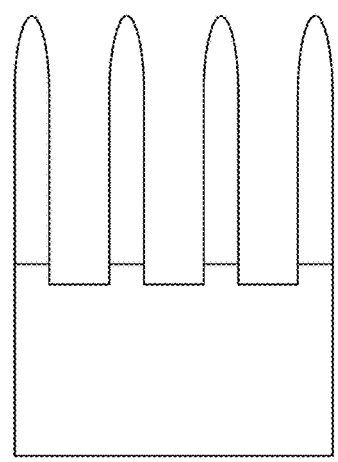
FIG. 7A   FIG. 7B

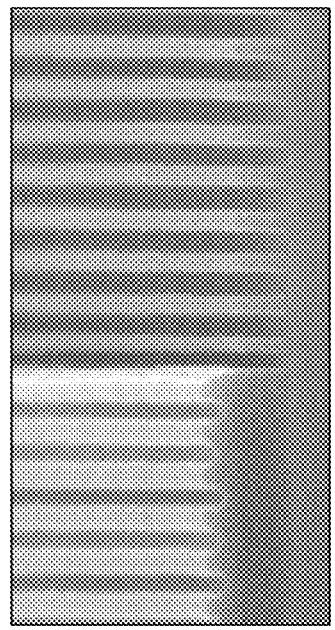
FIG. 12C HEALTHIER ARRAY EDGE
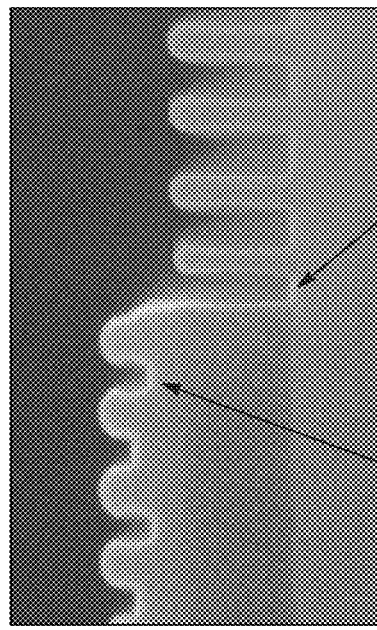
FIG. 12D NO PROTECT DUMMY / DEFINE BY DARC RECESS
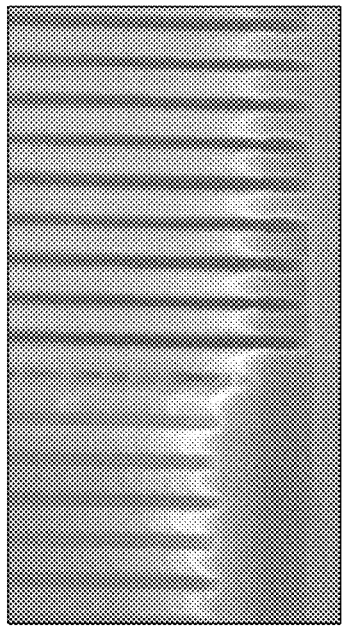
FIG. 12A DISCONTINUOUS EDGE PATTERN
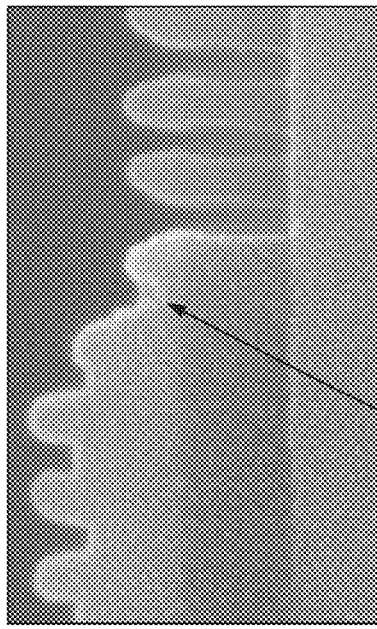
FIG. 12B UNSTABLE

US 10,347,487 B2

CELL CONTACT

BACKGROUND

The electronics industry is under constant pressure to both reduce component size as well as power requirements and has a market driven need to improve operation of integrated circuits, such as for example memory devices. Cell contacts are provided within such integrated circuits to electrically couple components within the integrated circuit. Improvements to cell contacts can be addressed by advances in design, material selection, and processing of cell contacts in integrated circuits.

BRIEF DESCRIPTION OF THE DRAWINGS

FIGS. 2-6 illustrate example features of forming a cell contact, according to various embodiments.

FIGS. 7A and 7B provide a comparison of a spacer profile of a conventional process and a spacer profile resulting after processing of the stage shown in FIG. 6, according to various embodiments.

FIGS. 12A-12D provide comparisons of a conventional method and a method such as associated with FIGS. 2-6 and 8-10, according to various embodiments.

DETAILED DESCRIPTION

Figure 1A:
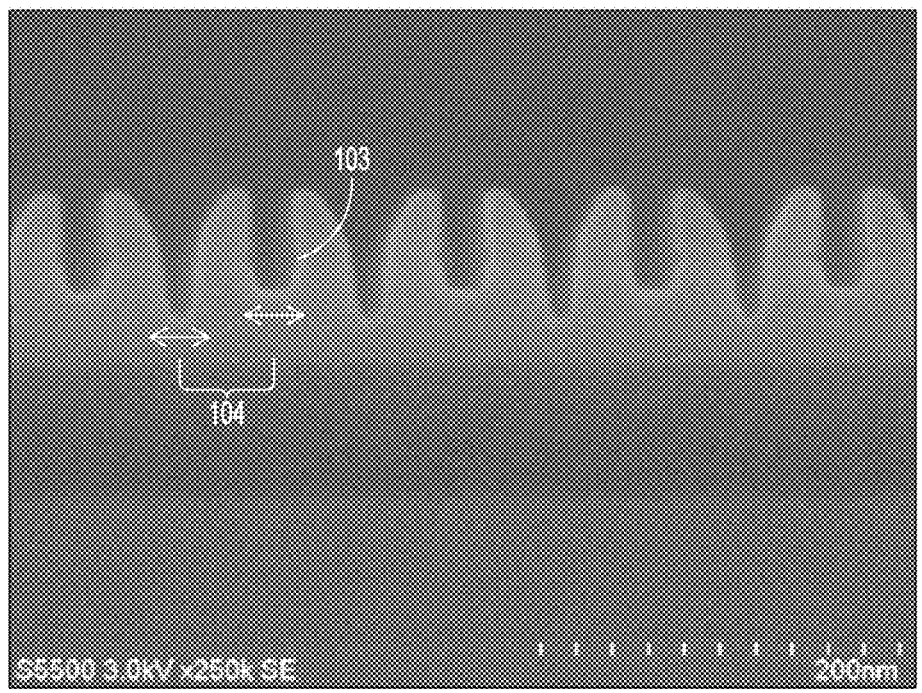
FIG. 1A shows an imbalance with respect to an interface between a dielectric anti-reflection coating and a dielectric spacer.

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

The term "horizontal" as used in this document is defined as a plane parallel to a conventional plane or surface of a substrate, such as that overlying a wafer or die, regardless of the actual orientation of the substrate at any point in time. The term "vertical" refers to a direction perpendicular to the horizontal as defined above. The terms "wafer" and "substrate" are used herein to refer generally to any structure on which integrated circuits are formed, and also to such structures during various stages of integrated circuit fabrication. A wafer may include a number of die in which an integrated circuit is disposed with respect to a respective substrate of the die.

A pitch double process is often used in fabricating electronic devices. Pitch can be taken to be the distance between repeated elements in a structure. A pitch double process is a process in which the pitch frequency is doubled, that is, the pitch in a pattern is reduced by half. A pitch double process can make use of spacers to extend scanner limitation in resolution. For example, with an immersion processing limitation of approximately 38 nm, a spacer process can be used to define a 19 nm process without deep ultraviolet (DUV) processing.

A chop mask is typically used in a pitch double process. A chop mask is a photolithography mask that can be used as a protection mask. In some instances, a chop mask may have a specific castle-like shape. A chop mask can be used in processes where pitch doubling or pitch multiplication is implemented to form access lines and digit lines in memory devices. The access lines may be word lines and the digit lines may be bit lines. Conventional chop mask processing in a pitch double approach usually have a very tight process window for an array edge pattern.

Edge of array issues may typically occur at the boundary between a chop mask and pitch double patterning. An abnormality at the edge of an array pattern can cause blowout or shorting issues, depending on the integration process. Conventionally, an abnormal edge pattern at the edge of array may be controlled by adding a dummy pattern region, which is later sacrificed in processing. However, noise associated with overlay (OVL) mark for scanner alignment or real time defect analysis (RDA) inspection can be an issue if edge pattern is abnormal, even if within a dummy pattern region. Shape of hard mask, such as an oxide/silicon nitride/resist, is very sensitive at the chop mask boundary. Snapping may happen if chop photo condition is not almost perfect.

As a result of the small process window, imbalance can occur as another issue that may arise in processing. In imbalance issues, a pitch double process can have an imbalance control issue with respect to a space critical dimension (CD).

Figure 1B:
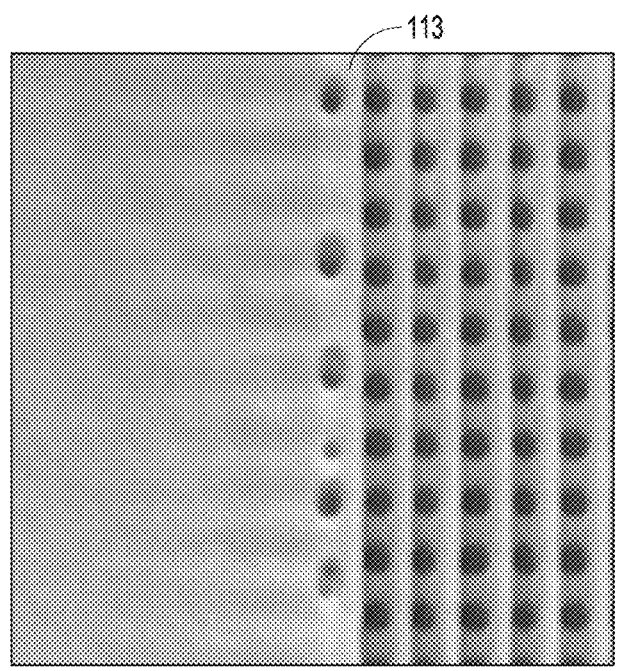
FIG. 1B shows a discontinuous edge pattern, which can affect process margin.

FIG. 1A shows an imbalance with respect to an interface 103 between a dielectric anti-reflection coating (DARC) and a dielectric spacer. This imbalance is shown as a delta 104, which can impact a DARC profile. FIG. 1B shows a discontinuous edge pattern 113, which can affect process margin.

In various embodiments, a silicon-rich dielectric anti-reflective coating (Si-rich DARC) and an additional underlayer (UL) coating can be implemented in processing. An underlayer is typically a layer on which other layers or structures can be formed. The additional UL can be material for an underlayer that can be used in processing, which processing may include subsequently removing the additional UL. The additional UL can be a resist underlayer. The inventors have discovered that this approach can provide a better process window, providing more margin to allow better process stability. A Si-rich DARC is a DARC whose composition includes more silicon than other elements in the composition. A Si-rich DARC can be a composition in which the number of silicon atoms is greater than 50% of the composition. A Si-rich DARC can be a composition in which the number of silicon atoms is greater than the number of other individual elements of the composition. Such processing, in addition to providing better process window, can address issues with respect to pitch. The improved process window and enhanced process stability can be provided by forming additional UL coating before spacer dry etch. Use of Si-rich DARC allows using a post spacer hard mask dry etch cleaning. This dry etch process can completely remove residual hard mask height. In addition, in this process chop mask resist thickness can be well controlled at the boundary of array pattern without concerns regarding chop mask registration or dose performance impacting the patterning.

Figure 2:
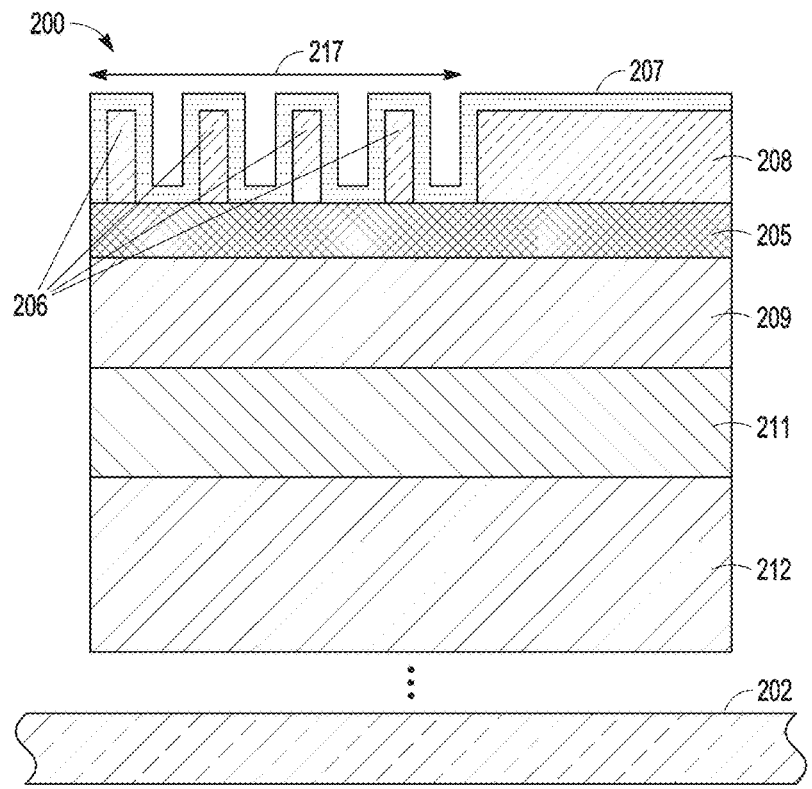

FIGS. 2-7 illustrate an embodiment of example features of forming a cell contact. FIG. 2 is a schematic of a structure 200 to be processed to form a cell contact. To focus on a process to provide an enhanced cell contact, FIG. 2 shows, as a starting point, a dielectric spacer 207 formed on a structure for the cell contact. Other structures of an integrated circuit for which the cell contact is formed are not shown. Structure 200 can include a patterned area 217 of pillars 206 on a Si-rich DARC region 205 formed on a dielectric region 209 above a substrate 202. Dielectric spacer 207 can be formed on pillars 206. Dielectric spacer 207 can also be formed on a region 208 terminating the patterned area 217 of pillars 206. Region 208 can be a remaining structure from which the patterned pillars 206 are formed. Dielectric region 209 may be disposed on a base dielectric 211 that is formed on a spin-on dielectric (SOD) 212 above substrate 202. Other material regions may be structured between SOD 212 and substrate 202.

Substrate 202 can be a silicon-based substrate, which is a substrate that can be used in fabricating an integrated circuit using fabrication techniques associated with silicon related electronic devices. Substrate 202 is typically a flat piece of material in and on which a set of electronic circuits are formed, referred to as an integrated circuit (IC). An IC can also be referred to as a chip or a microchip. The normally flat piece of material is typically a substrate of semiconductor material or insulative material. The IC can include a large number of active devices arranged to operatively perform a number of functions for which the IC is designed. An active device, in electronic terms, is typically a type of circuit component capable of electrically controlling electron flow, while passive devices are typically components incapable of controlling current by using another electrical signal. ICs typically include combinations of active and passive devices.

Spin-on processing is used in many industries to deposit very thin coatings on flat substrates, including wafers for ICs such as silicon wafers. In a spin-on process, a liquid precursor solution can be dispensed onto the surface of the substrate, where the solution spreads out evenly over the surface due to large rotational forces caused by spinning the substrate. SOD 212 can include flowable dielectric material. The flowable dielectric material can include one or more flowable organic materials. The flowable dielectric material can be flowable dielectric polymers that contain only silicon, oxygen, and hydrogen. SOD 212 can be a spin-on oxide. In some applications of a cell contact having a SOD, SOD 212 can have a thickness of about 1500 A. SOD 212 is not limited to 1500 A, but can be more of less than 1500 A depending on the application for the cell contact.

Base dielectric 211, which may be disposed on SOD 212, can be a dielectric region including tetraethyl orthosilicate (TEOS). TEOS is a chemical compound having the formula $Si(OC_2H_5)_4$. Other oxides of silicon can be used in base dielectric 211. Additionally, other electrically insulative oxides can be used in base dielectric 211. In some applications of a cell contact having a base dielectric on a SOD, base dielectric 211 can have a thickness of about 800 A. Base dielectric 211 is not limited to 800 A, but can be more of less than 800 A depending on the application for the cell contact.

Dielectric region 209, which may be disposed on base dielectric 211, can be a dielectric region including diamond-like carbon. Other dielectrics may be used in dielectric region 209. Diamond-like carbon (DLC) is an amorphous carbon material that displays some of the typical properties of diamond such as low friction, high hardness, and high corrosion resistance. DLC can be formed as a nanocomposite coating. In some applications of a cell contact using a dielectric region on a base dielectric, dielectric region 209 can have a thickness of about 800 A. Dielectric region 209 is not limited to 800 A, but can be more of less than 800 A depending on the application for the cell contact.

Si-rich DARC region 205, which may be disposed on dielectric region 209, can be one or more materials selected from a group of materials including a silicon-rich oxide, a silicon-rich nitride, and a silicon-rich oxynitride. Other dielectrics that include silicon in a Si-rich arrangement can be used in Si-rich DARC region 205. In some applications of a cell contact using a Si-rich DARC region on another dielectric region. Si-rich DARC region 205 can have a thickness of about 600 A. Si-rich DARC region 205 is not limited to 600 A, but can be more of less than 600 A depending on the application for the cell contact.

Pillars 206 and terminating region 208, which may be disposed on Si-rich DARC region 205, can include DLC. Other dielectric materials may be used in pillars 206 and terminating region 208. In some embodiments, the material for pillars 206 and terminating region 208 can be the same material used in dielectric region 209. Dielectric spacer 207 can be disposed on pillars 206 and terminating region 208. Dielectric spacer 207 can be disposed in regions between pillars 206 in the pattern area of pillars 206, which can include being disposed on Si-rich DARC region 205 between adjacent pillars 206. Dielectric spacer 207 can be a dielectric oxide such as, but not limited to, silicon oxide or other spacer oxide.

Figure 3:
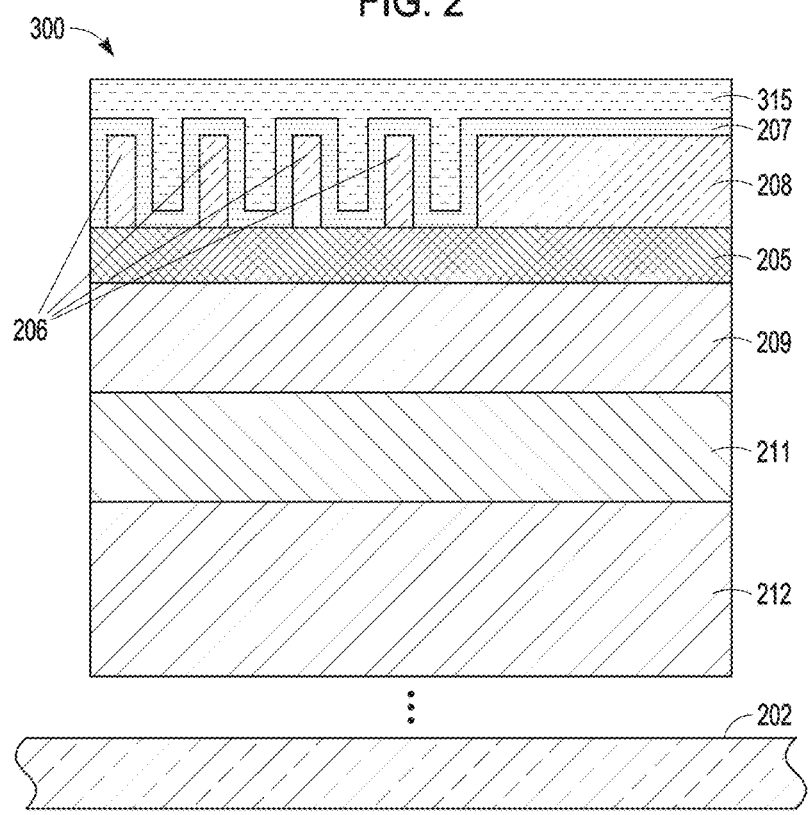

FIG. 3 is a schematic of a structure 300 after a UL coat 315 has been applied to structure 200 of FIG. 2. UL coat 315 can be realized as a region of resist material. The resist material of UL coat 315 can be a resist material used in semiconductor processing and is not limited to a particular resist material. UL coat 315 is formed on dielectric spacer 207. The UL coat 315 formed on dielectric spacer 207 is also formed on the dielectric spacer 207 in each of the regions between pillars 206.

Figure 4:
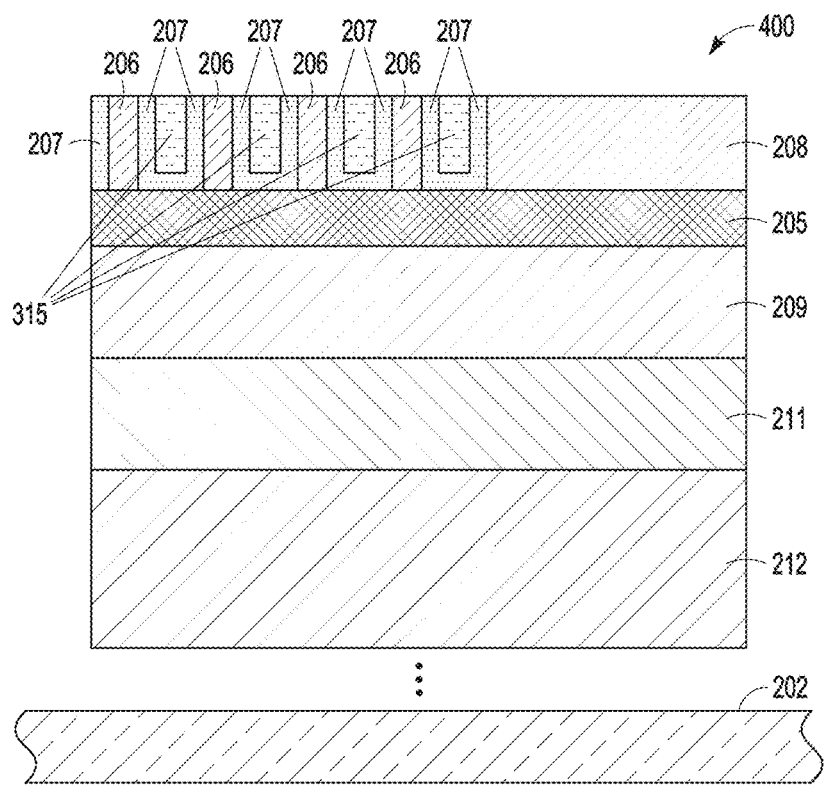

FIG. 4 is a schematic of a structure 400 after structure 300 of FIG. 3 has been etched back, removing portions of UL coat 315 and portions of dielectric spacer 207. The portions of UL coat 315 and the portions of dielectric spacer 207 removed include UL coat material and dielectric spacer that extended from terminating region 208 and a plane parallel to and intersecting the top surface of terminating region 208. The etch back may include some removal of terminating region 208, dielectric spacer 207, UL coat 315, and pillars 206 back from the plane parallel to and intersecting the top surface of terminating region 208. After etch back, structure 400 has a top surface that includes top surfaces of patterned pillars 206, top surfaces of dielectric spacer 207 between adjacent pillars 206, top surfaces of UL coat 315 within dielectric spacer 207 between adjacent pillars 206, and a top surface of terminating region 208. After etch back, patterned pillars 206, dielectric spacer 207 between adjacent pillars 206, and terminating region 208 extend vertically a distance from Si-rich DARC region 205 that can be less than the corresponding distance before etch back. Dielectric spacer 207 between adjacent pillars 206 has UL coat 315 within dielectric spacer 207.

Figure 5:
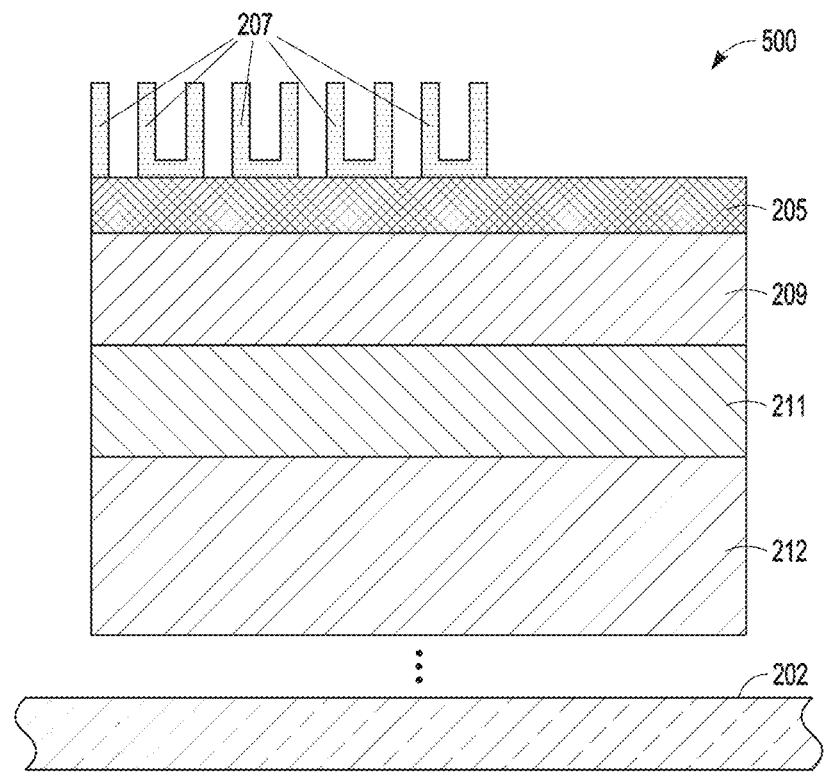

FIG. 5 is a schematic of a structure 500 after structure 400 of FIG. 4 has been subjected to a strip of material from the top of structure 400. The strip can be conducted to selectively remove UL coat 315 within dielectric spacer 207, remove pillars 206 between dielectric spacers 207, and remove terminating region 208. The stripping can be conducted using one or more precursors that selectively remove material at appropriate temperatures for specific times. The stripping may be conducted in stages for stripping of specific material.

FIG. 6 is a schematic of a structure 600 after structure 500 of FIG. 5 has been subjected to a spacer dry etch and removing of a portion of Si-rich DARC region 205 forming a recessed Si-rich DARC region 205. Spacer dry etch can be preformed to remove portions of dielectric spacer of 207 of FIG. 5 that were horizontally positioned between vertical extensions of dielectric spacer 207 that were disposed along vertical walls of pillars 206 that were removed. The dry etch and recess can result in a pattern of vertical columns 616 having material of dielectric spacer 207 on top of material of Si-rich DARC region 205. Dry etching and removal can be conducted using one or more precursors that selectively remove material at appropriate temperatures for specific times. The dry etching and removal may be conducted in stages for stripping of specific material. These vertical columns 616 are patterned horizontally on a new surface of recessed Si-rich DARC region 205. Without considering Si-rich DARC in these vertical columns 616, Si-rich DARC region 205 has a thickness from dielectric region 209 that is less than the thickness before the dry etch and recess process. The pattern of vertical columns 616 can have a pitch that is half the pitch of the pattern of pillars 206.

FIG. 7A and FIG. 7B provide a comparison of a spacer profile of a conventional process and a spacer profile resulting after processing of the stage shown in FIG. 6. As can be seen in FIG. 7A, conventional processing can result in the imbalance shown. FIG. 7B shows processing enhancements resulting from using UL coating. In addition to improvements with respect to imbalance, each spacer, such as each vertical column 616, can have a uniform structure. The uniform structure may be a symmetric spacer with respect to the vertical in the center of the vertical spacer. This uniform structure can provide for better alignments in further processing of a cell contact.

Figure 8:
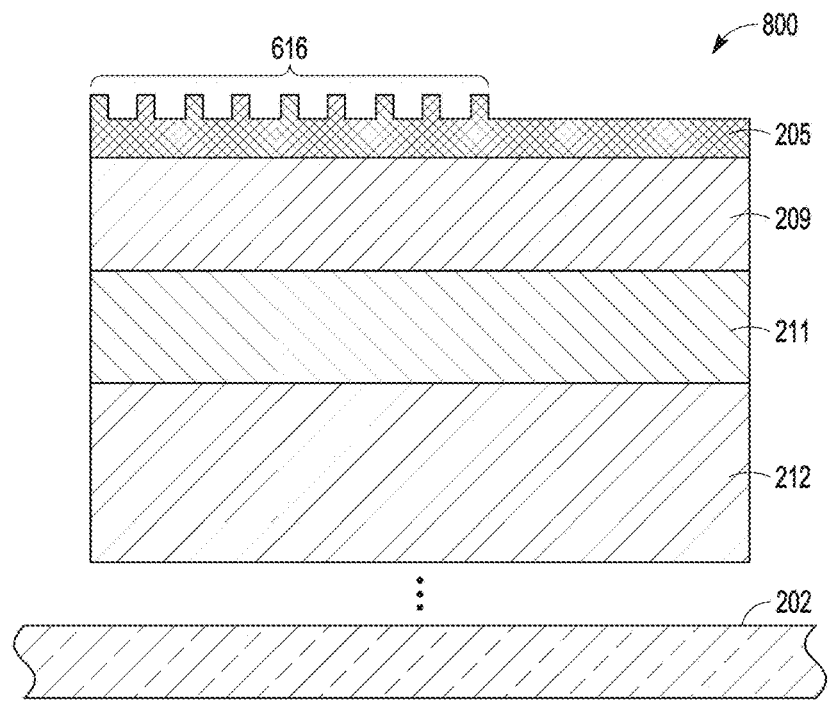
FIGS. 8-10 illustrate example features of forming a cell contact subsequent to performance of features of FIG. 6, according to various embodiments.

FIG. 8 is a schematic of a structure 800 after structure 600 of FIG. 6 has been subjected to removal of material of dielectric spacer 207 from each vertical column 616. Each vertical column 616 may be subjected to hydrogen fluoride. Hydrogen fluoride (HF) may be applied as a wet etch in a solution of 100:1 of $H_2O$ to HF. Other concentrations may be used. This wet etch, in addition to removing the material of dielectric spacer 207 from each vertical column 616, may remove some Si-rich DARC from each vertical column 616 and further reduce the thickness of Si-rich DARC region 205. For example, with an original thickness of 600 A of Si-rich DARC region 205 in structure 200, after the UL strip, spacer dry etch, recess of Si-rich DARC region 205, and wet etch to remove remaining spacer material in vertical columns 616, Si-rich DARC region 205 may have a thickness of about 250 A.

Figure 9:
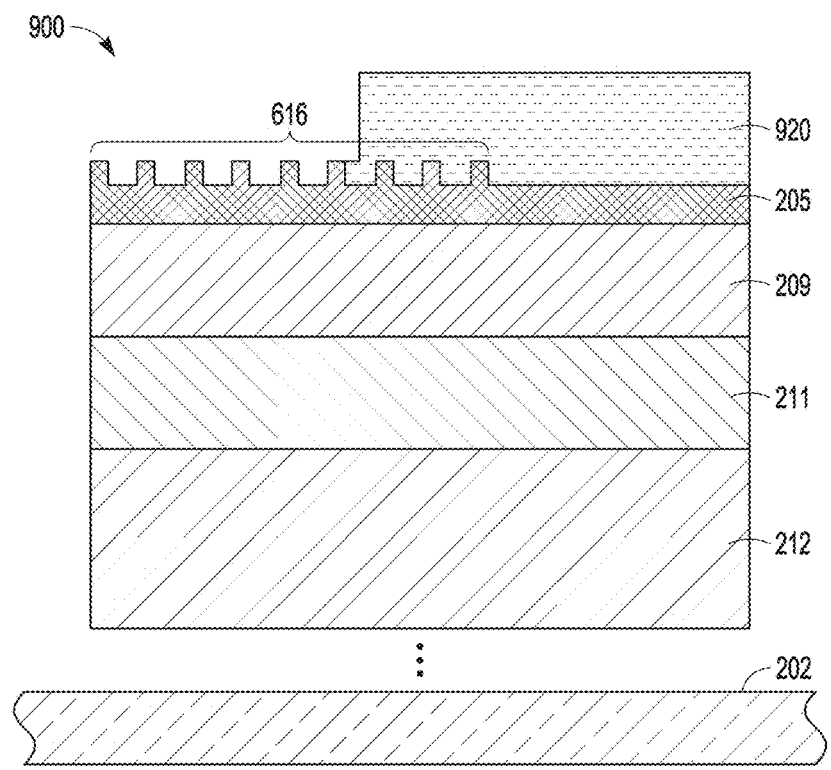

FIG. 9 is a schematic of a structure 900 after structure 800 of FIG. 8 has been subjected to a formation of a chop mask 920 on portions of the pattern of vertical columns 616 and portions of the recessed Si-rich DARC region 205. Chop mask 920 may be formed by depositing a dielectric oxide and/or a dielectric nitride. The dielectric oxide can be, but is not limited to, silicon oxide. The dielectric nitride can be, but is not limited to, silicon nitride. A combination of dielectric oxide and dielectric nitride can be, but is not limited to, silicon oxynitride.

Figure 10:
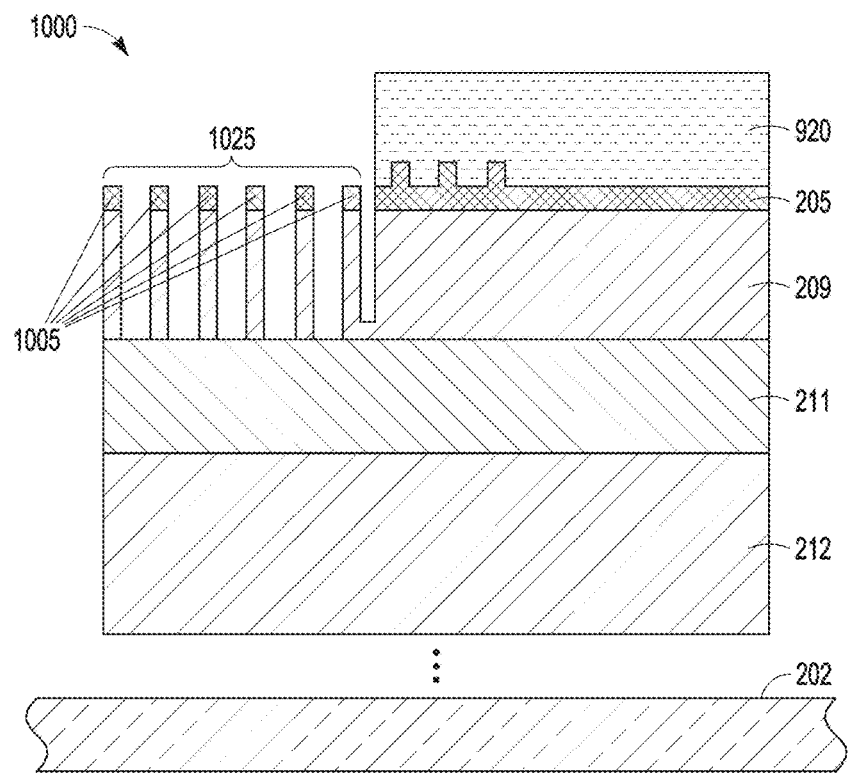
Figure 11:
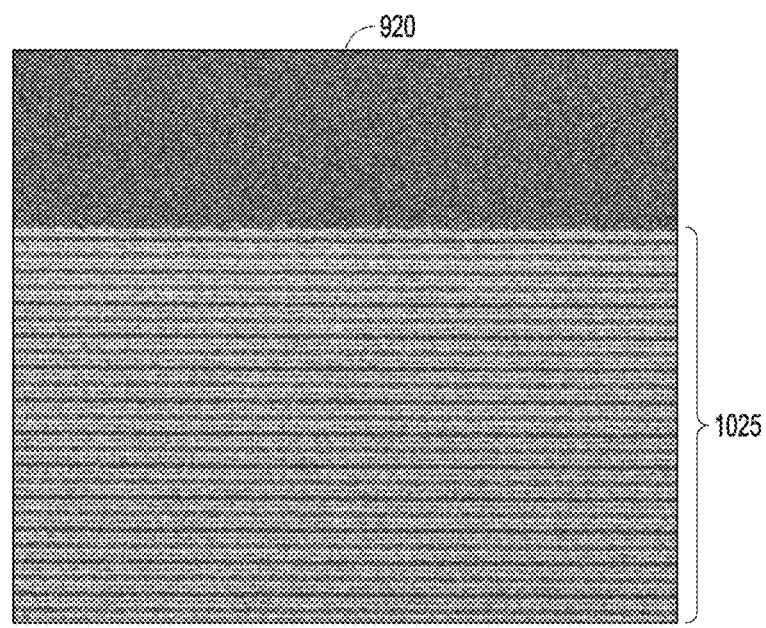
FIG. 11 shows a top view of an example of a chop mask and an array of columns after formation of the array of columns, according to various embodiments.

FIG. 10 is a schematic of a structure 1000 after structure of FIG. 9 has been subjected to a dry etch. The dry etch is selectively applied with etchant precursors at a rate and temperature to remove dielectric region 209 except for areas of dielectric region 209 directly under chop mask 920. The dry etch is selectively applied with etchant precursors at a rate and temperature to remove the remaining recessed Si-rich DARC 205 but stopping such that portions of dielectric region 209 under a cap 1005 of Si-rich DARC from vertical columns 616 remain. The portions of dielectric region 209 under a cap 1005 of Si-rich DARC from vertical columns 616, after the dry etch, form an array of separated columns 1025 on base dielectric 211. With dielectric region 209 directly under chop mask 920 remaining, dielectric region 209 directly under chop mask 920 forms a termination of the array of separated columns 1025 on base dielectric 211 in dielectric region 209. FIG. 11 shows a top view of chop mask 920 and the array of columns 1025 after formation of the array of columns 1025. The regions between the columns 1025 of the array of columns 1025 can be filled conductive material, forming a cell contact.

FIGS. 12A-12D illustrate differences between a convenient method forming a cell contact and forming a cell contact using a method such as associated with FIGS. 2-6 and 8-10. FIGS. 12A and 12B provide views of a formations using a conventional method, while FIGS. 12C and 12D provide views of formation of a method such as associated with FIGS. 2-6 and 8-10. In FIG. 12A, a discontinuous edge pattern is shown. In contrast, in FIG. 12C, a healthier array edge is shown. In FIG. 12B, an unstable region is shown. In contrast, in FIG. 12D, a stable region, corresponding to the unstable region of FIG. 12B, is shown. This stable region can be defined by the DARC recess prior to forming the chop mask. The structure of FIGS. 12C and 12D is formed without a dummy protection array, which aids in less noise for RDA.

Figure 13:
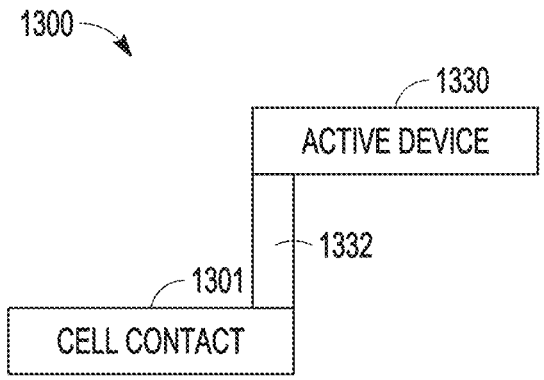
FIG. 13 is a representation of an example relationship of an active device and a cell contact in an integrated circuit, according to various embodiments.

FIG. 13 is a representation of a relationship of an active device 1330 and a cell contact 1301 in an integrated circuit 1300. Cell contact 1301 can be structured according to methods similar to the methods, as taught herein, represented by FIGS. 2-6 and 8-10, for example. Cell contact 1301 can include an array of dielectric columns on a base dielectric with conductive material between the dielectric columns. Active device 1330 can be coupled to the conductive material between two dielectric columns of cell contact 1301. Active device 1330 can be coupled to cell contact 1301 by a via 1332. The base dielectric can include, but is not limited to, tetraethyl orthosilicate disposed on a spin-out dielectric above a substrate.

Each dielectric column of the array of cell contact 1301 can have a cap. The cap can include a silicon-rich dielectric anti-reflective coating. The silicon-rich dielectric anti-reflective coating can include, but is not limited to, one or more materials selected from a group of materials including a silicon-rich oxide, a silicon-rich nitride, and a silicon-rich oxynitride. The dielectric columns can include the cap disposed on a DLC column. Alternatively, the dielectric columns can be dielectric columns without a cap. Cell contact 1301 can include a dielectric region adjacent the array of dielectric columns, providing a border to the array of dielectric columns.

Figure 14:
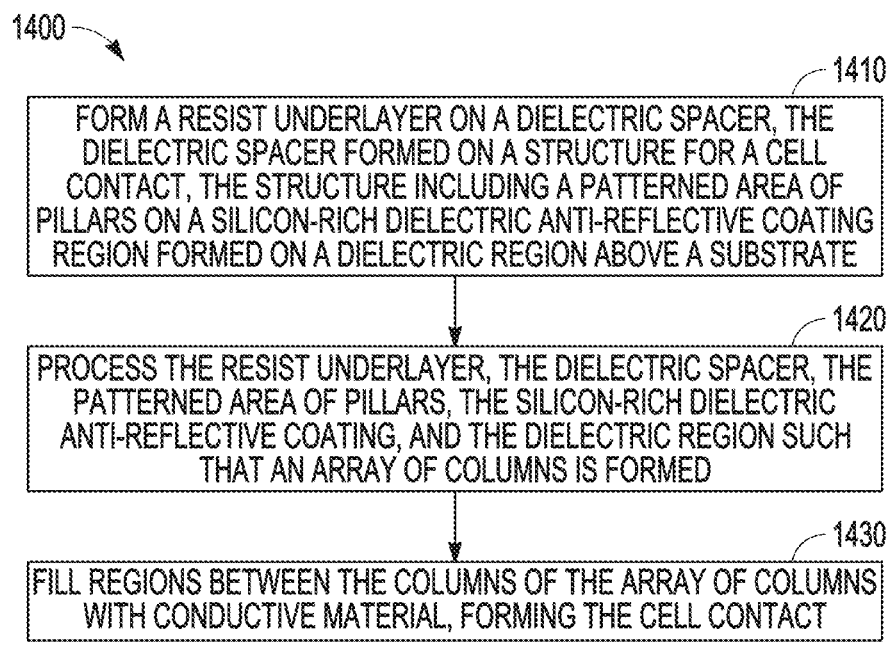
FIG. 14 is flow diagram of an example method of forming a cell contact, according to various embodiments.

FIG. 14 is a flow diagram of an embodiment of an example method 1400 of forming a cell contact. At 1410, a resist underlayer is formed on a dielectric spacer, where the dielectric spacer is formed on a structure for a cell contact. Forming the resist underlayer on the dielectric spacer can include forming the resist underlayer on an oxide region formed as the dielectric spacer. The oxide region can include silicon oxide. The structure can include a patterned area of pillars on a silicon-rich dielectric anti-reflective coating region formed on a dielectric region above a substrate. The pattern area of pillars can include diamond-like carbon. The silicon-rich dielectric anti-reflective coating can include, but is not limited to, one or more materials selected from a group of materials including a silicon-rich oxide, a silicon-rich nitride, and a silicon-rich oxynitride. Processing can include forming the array of columns with a pitch that is half the pitch of the patterned area of pillars.

At 1420, the resist underlayer, the dielectric spacer, the patterned area of pillars, the silicon-rich dielectric anti-reflective coating, and the dielectric region are processed such that an array of columns is formed in the dielectric region. Processing the resist underlayer, the dielectric spacer, the silicon-rich dielectric anti-reflective coating, and the dielectric region can include forming each column with a cap region, where the cap region contains remaining portions of the silicon-rich dielectric anti-reflective coating. Forming each column with a cap region can include forming each column from material of the dielectric region. The material of the dielectric region can include diamond-like carbon. At 1430, regions between the columns of the array of columns are filled with conductive material, forming the cell contact.

Variations of method 1400 or methods similar to method 1400 can include a number of different embodiments that may depend on the application of such methods and/or the architecture of systems in which such methods are implemented. Such methods can include prior to forming the resist underlayer, forming the dielectric spacer on the patterned area of pillars and on a region adjacent the patterned area, where the region adjacent the patterned area terminated the patterned area. Such variations can include forming the array of columns in the dielectric region by reducing the silicon-rich dielectric anti-reflective coating region to have columns of silicon-rich dielectric anti-reflective coating on the reduced silicon-rich dielectric anti-reflective coating region, forming a chop mask on a portion of the reduced silicon-rich dielectric anti-reflective coating region, removing portions of the reduced silicon-rich dielectric anti-reflective coating region adjacent the chop mask, and removing portions of the dielectric region forming the array of columns adjacent the remaining dielectric region. Removing portions of the dielectric region forming the array of columns in the dielectric region can include forming the array of columns in the dielectric region adjacent material of the dielectric region below the chop mask and removing material of the dielectric region from between the columns with the columns extending to a base dielectric on which the dielectric region was formed. The base dielectric can include tetraethyl orthosilicate. The tetraethyl orthosilicate can be formed on a spin-out dielectric disposed above a substrate.

Figure 15:
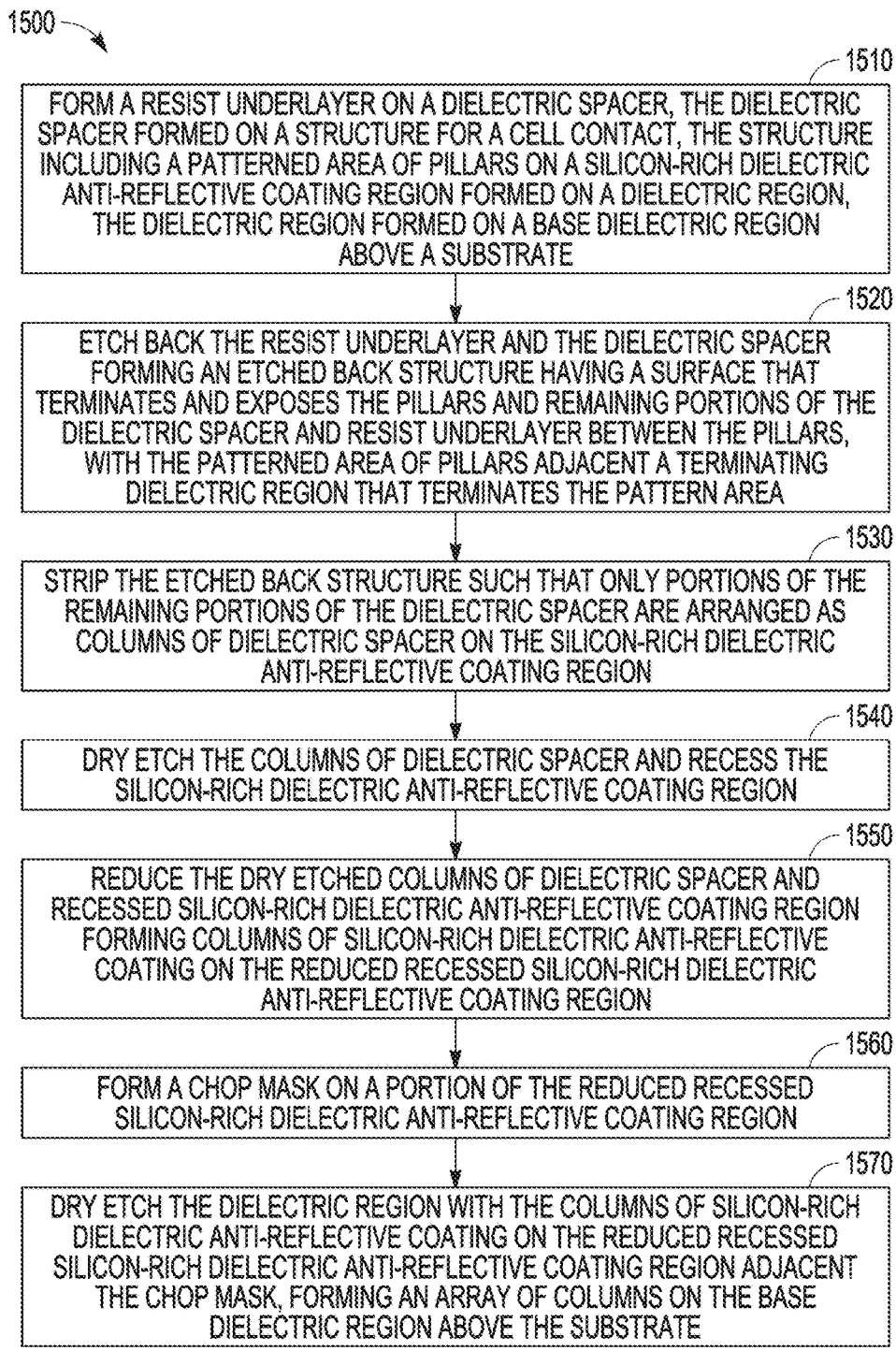
FIG. 15 is flow diagram of an example method of forming a cell contact, according to various embodiments.

FIG. 15 is flow diagram of an embodiment of an example method 1500 of forming a cell contact. At 1510, a resist underlayer is formed on a dielectric spacer, where the dielectric spacer is formed on a structure for a cell contact. The structure can include a patterned area of pillars on a silicon-rich dielectric anti-reflective coating region formed on a dielectric region. The dielectric region can be formed on a base dielectric region above a substrate. At 1520, the resist underlayer and the dielectric spacer is etched back forming an etched back structure having a surface that terminates and exposes the pillars and remaining portions of the dielectric spacer and resist underlayer between the pillars. The patterned area of pillars can be formed adjacent a terminating dielectric region that terminates the pattern area.

At 1530, the etched back structure is stripped such that only portions of the remaining portions of the dielectric spacer are arranged as columns of dielectric spacer on the silicon-rich dielectric anti-reflective coating region. At 1540, the columns of dielectric spacer and recessing the silicon-rich dielectric anti-reflective coating region are dry etched. At 1550, the dry etched columns of dielectric spacer and recessed silicon-rich dielectric anti-reflective coating region are reduced forming columns of silicon-rich dielectric anti-reflective coating on the reduced recessed silicon-rich dielectric anti-reflective coating region. Reducing the dry etched columns of dielectric spacer and recessed silicon-rich dielectric anti-reflective coating region can include applying hydrogen fluoride.

At 1560, a chop mask is formed on a portion of the reduced recessed silicon-rich dielectric anti-reflective coating region. At 1570, the dielectric region with the columns of silicon-rich dielectric anti-reflective coating on the reduced recessed silicon-rich dielectric anti-reflective coating region adjacent the chop mask is dry etched, forming an array of columns on the base dielectric region above the substrate. Forming the array of columns on the base dielectric region above the substrate can include maintaining a portion of the columns of silicon-rich dielectric anti-reflective coating as caps on the columns of the array of columns. Regions between the columns of the array of columns can be filled with conductive material, forming the cell contact.

In various embodiments, methods of forming a cell contact in an integrated circuit can include performing selected features and/or combinations of selected features from method 1400, method 1500, methods similar to methods 1400 and 1500, and techniques similar to techniques associated with FIGS. 2-6 and 8-10, as taught herein. Using a Si-rich DARC and an additional UL coating can maintain pitch double's benefit of better line imbalance in processing electronic devices. Processing, as taught herein, can also address a space imbalance issues as well as issues of instability at an array edge.

Figure 16:
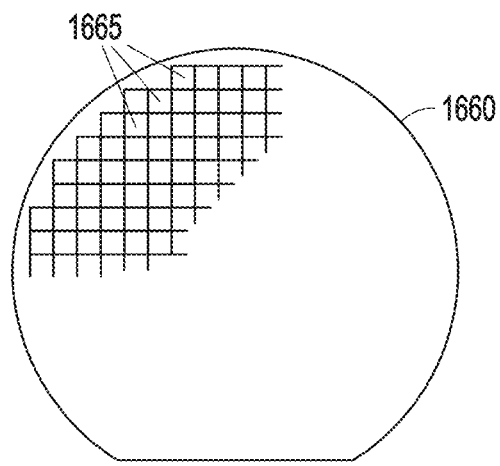
FIG. 16 illustrates an example of a wafer arranged to provide multiple electronic components, according to various embodiments.

FIG. 16 illustrates an embodiment of an example of a wafer 1660 arranged to provide multiple electronic components. Wafer 1660 can be provided as a wafer in which a number of dice 1665 can be fabricated. Alternatively, wafer 1660 can be provided as a wafer in which the number of dice 1665 have been processed to provide electronic functionality and are awaiting singulation from wafer 1660 for packaging. Wafer 1660 can be provided as a semiconductor wafer, a semiconductor on insulator wafer, or other appropriate wafer for processing electronic devices such as an integrated circuit chips. Wafer 1660 can be fabricated in accordance with methods associated with any embodiment or combination of embodiments related to FIGS. 2-6, 8-11, and 13-15.

Using various masking and processing techniques, each die 1665 can be processed to include functional circuitry such that each die 1665 is fabricated as an integrated circuit with the same functionality and packaged structure as the other dice on wafer 1660. Alternatively, using various masking and processing techniques, various sets of dice 1665 can be processed to include functional circuitry such that not all of the dice 1665 are fabricated as an integrated circuit with the same functionality and packaged structure as the other dice on wafer 1660. A packaged die having circuits integrated thereon providing electronic capabilities can be referred to as an IC.

Wafer 1660 can comprise multiple dice 1665. Each die 1665 of the multiple dice can include a cell contact. Each die 1665 on wafer 1660 can include an integrated circuit having an active device coupled to a cell contact. The cell contact can include an array of dielectric columns on a base dielectric, where each dielectric column has a cap including a silicon-rich dielectric anti-reflective coating. The base dielectric can include, but is not limited to, tetraethyl orthosilicate disposed on a spin-out dielectric above a substrate. Conductive material may be disposed between the dielectric columns, and the cell contact can include a dielectric region adjacent the array of dielectric columns, providing a border to the array of dielectric columns. The active device can be coupled to the conductive material between two dielectric columns of the cell contact. The dielectric columns can include, but is not limited to, diamond-like carbon. The silicon-rich dielectric anti-reflective coating can include, but is not limited to, one or more materials selected from a group of materials including a silicon-rich oxide, a silicon-rich nitride, and a silicon-rich oxynitride.

Figure 17:
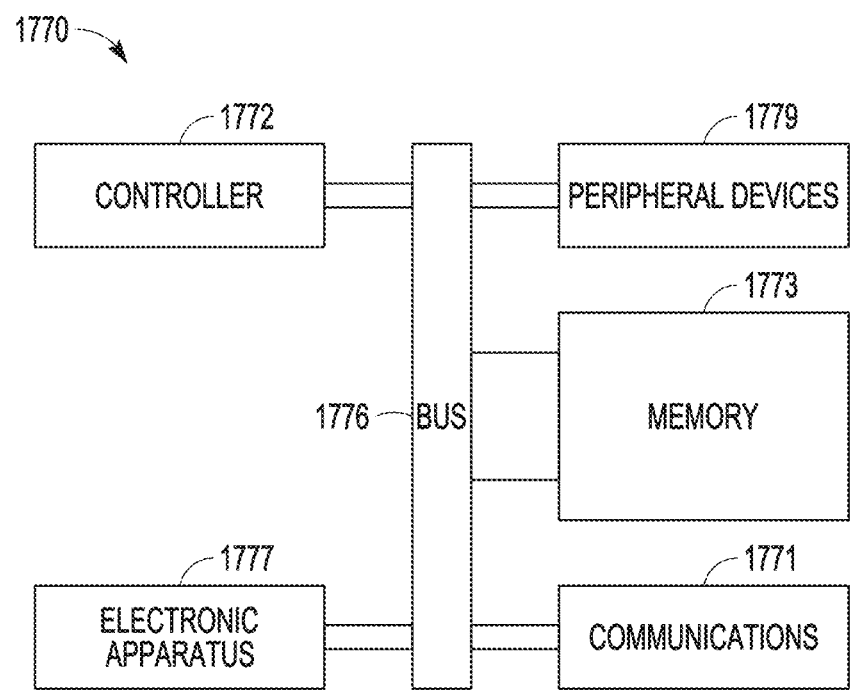
FIG. 17 shows a block diagram of an example system that includes at least one integrated circuit structured with a cell contact, according to various embodiments.

FIG. 17 shows a block diagram of an embodiment of an example system 1770 that includes at least one integrated circuit structured having a cell contact. The architectures of integrated circuits having cell contacts can be realized in a manner similar to or identical to structures in accordance with various embodiments discussed herein. System 1770 can include a controller 1772 operatively coupled to a memory 1773. System 1770 can also include an electronic apparatus 1777, peripheral devices 1779, and communications component 1771. One or more of controller 1772, memory 1773, electronic apparatus 1777, peripheral devices 1779, and communications component 1771 can be in the form of one or more ICs, each IC having one or more cell contacts.

A bus 1776 provides electrical conductivity between and/or among various components of system 1770. In an embodiment, bus 1776 can include an address bus, a data bus, and a control bus, each independently configured. In an alternative embodiment, bus 1776 can use common conductive lines for providing one or more of address, data, or control, the use of which is regulated by controller 1772. Controller 1772 can be in the form or one or more processors.

Electronic apparatus 1777 may include additional memory. Memory in system 1770 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, and magnetic based memory.

Peripheral devices 1779 may include displays, imaging devices, printing devices, wireless devices, additional storage memory, and control devices that may operate in conjunction with controller 1772. In various embodiments, system 1770 includes, but is not limited to, fiber optic systems or devices, electro-optic systems or devices, optical systems or devices, imaging systems or devices, and information handling systems or devices such as wireless systems or devices, telecommunication systems or devices, and computers.

As taught herein, using a Si-rich DARC and an additional UL coating can maintain pitch double's benefit of better line imbalance in processing electronic devices. Processing, as taught herein, can also address a space imbalance issues as well as issues of instability at an array edge.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Thus, the following claims are hereby incorporated into the Detailed Description, with each claim standing on its own as a separate embodiment.

What is claimed is:

1. A method comprising:
   forming a resist underlayer on a dielectric spacer, the dielectric spacer formed on a structure for a cell contact, the structure including a patterned area of pillars on a silicon-rich dielectric anti-reflective coating region formed on a dielectric region above a substrate, material of the silicon-rich dielectric anti-reflective coating region being different from material of the dielectric region;
   processing the resist underlayer, the dielectric spacer, the patterned area of pillars, the silicon-rich dielectric anti-reflective coating, and the dielectric region such that an array of columns is formed in the dielectric region; and
   filling regions between the columns of the array of columns with conductive material, forming the cell contact.

2. A method comprising:
   forming a resist underlayer on a dielectric spacer, the dielectric spacer formed on a structure for a cell contact, the structure including a patterned area of pillars on a silicon-rich dielectric anti-reflective coating region formed on a dielectric region above a substrate;
   processing the resist underlayer, the dielectric spacer, the patterned area of pillars, the silicon-rich dielectric anti-reflective coating, and the dielectric region such that an array of columns is formed in the dielectric region; and
   filling regions between the columns of the array of columns with conductive material, forming the cell contact, wherein processing the resist underlayer, the dielectric spacer, the silicon-rich dielectric anti-reflective coating, and the dielectric region includes forming each column with a cap region, the cap region containing remaining portions of the silicon-rich dielectric anti-reflective coating.

3. The method of claim 2, wherein forming each column with a cap region includes forming each column from material of the dielectric region.

4. The method of claim 3, wherein the material of the dielectric region includes diamond-like carbon.

5. The method of claim 1, wherein the pattern area of pillars includes diamond-like carbon.

6. The method of claim 1, wherein the silicon-rich dielectric anti-reflective coating includes one or more materials selected from a group of materials including a silicon-rich oxide, a silicon-rich nitride, and a silicon-rich oxynitride.

7. A method comprising:
   forming a resist underlayer on a dielectric spacer, the dielectric spacer formed on a structure for a cell contact, the structure including a patterned area of pillars on a silicon-rich dielectric anti-reflective coating region formed on a dielectric region above a substrate;
   processing the resist underlayer, the dielectric spacer, the patterned area of pillars, the silicon-rich dielectric anti-reflective coating, and the dielectric region such that an array of columns is formed in the dielectric region; and
   filling regions between the columns of the array of columns with conductive material, forming the cell contact, wherein the processing includes forming the array of columns with a pitch that is half the pitch of the patterned area of pillars.

8. The method of claim 1, wherein forming the resist underlayer on the dielectric spacer includes forming the resist underlayer on an oxide region formed as the dielectric spacer.

9. The method of claim 8, wherein the oxide region includes silicon oxide.

10. The method of claim 1, wherein the method includes, prior to forming the resist underlayer, forming the dielectric spacer on the patterned area of pillars and on a region adjacent the patterned area, the region adjacent the patterned area terminating the patterned area.

11. A method comprising:
   forming a resist underlayer on a dielectric spacer, the dielectric spacer formed on a structure for a cell contact, the structure including a patterned area of pillars on a silicon-rich dielectric anti-reflective coating region formed on a dielectric region above a substrate;
   processing the resist underlayer, the dielectric spacer, the patterned area of pillars, the silicon-rich dielectric anti-reflective coating, and the dielectric region such that an array of columns is formed in the dielectric region; and
   filling regions between the columns of the array of columns with conductive material, forming the cell contact, wherein the method includes forming the array of columns in the dielectric region by reducing the silicon-rich dielectric anti-reflective coating region to have columns of silicon-rich dielectric anti-reflective coating on the reduced silicon-rich dielectric anti-reflective coating region, forming a chop mask on a portion of the reduced silicon-rich dielectric anti-reflective coating region, removing portions of the reduced silicon-rich dielectric anti-reflective coating region adjacent the chop mask, and removing portions of the dielectric region forming the array of columns adjacent the remaining dielectric region.

12. The method of claim 11, wherein removing portions of the dielectric region forming the array of columns in the dielectric region includes forming the array of columns in the dielectric region adjacent material of the dielectric region below the chop mask and removing material of the dielectric region from between the columns with the columns extending to a base dielectric on which the dielectric region was formed.

13. The method of claim 12, wherein the base dielectric includes tetraethyl orthosilicate.

14. The method of claim 13, where the tetraethyl orthosilicate is formed on a spin-out dielectric disposed above a substrate.

15. A method comprising:
   forming a resist underlayer on a dielectric spacer, the dielectric spacer formed on a structure for a cell contact, the structure including a patterned area of pillars on a silicon-rich dielectric anti-reflective coating region formed on a dielectric region, the dielectric region formed on a base dielectric region above a substrate;
   etching back the resist underlayer and the dielectric spacer forming an etched back structure having a surface that terminates and exposes the pillars and remaining portions of the dielectric spacer and resist underlayer between the pillars, with the patterned area of pillars adjacent a terminating dielectric region that terminates the pattern area;
   stripping the etched back structure such that only portions of the remaining portions of the dielectric spacer are arranged as columns of dielectric spacer on the silicon-rich dielectric anti-reflective coating region;
   dry etching the columns of dielectric spacer and recessing the silicon-rich dielectric anti-reflective coating region;
   reducing the dry etched columns of dielectric spacer and recessed silicon-rich dielectric anti-reflective coating region forming columns of silicon-rich dielectric anti-reflective coating on the reduced recessed silicon-rich dielectric anti-reflective coating region;
   forming a chop mask on a portion of the reduced recessed silicon-rich dielectric anti-reflective coating region; and
   dry etching the dielectric region with the columns of silicon-rich dielectric anti-reflective coating on the reduced recessed silicon-rich dielectric anti-reflective coating region adjacent the chop mask, forming an array of columns on the base dielectric region above the substrate.

16. The method of claim 15, wherein forming the array of columns on the base dielectric region above the substrate includes maintaining a portion of the columns of silicon-rich dielectric anti-reflective coating as caps on the columns of the array of columns.

17. The method of claim 15, wherein the method includes filling regions between the columns of the array of columns with conductive material, forming the cell contact.

18. The method of claim 15, wherein reducing the dry etched columns of dielectric spacer and recessed silicon-rich dielectric anti-reflective coating region includes applying hydrogen fluoride.

19. An integrated circuit comprising:
   an active device; and
   a cell contact coupled to the active device, the cell contact including:
      an array of dielectric columns on a base dielectric, each dielectric column having a cap, the cap including a silicon-rich dielectric anti-reflective coating;
      conductive material between the dielectric columns; and
      a dielectric region adjacent the array of dielectric columns, providing a border to the array of dielectric columns.

20. The integrated circuit of claim 19, wherein the active device is coupled to the conductive material between two dielectric columns.

21. The integrated circuit of claim 19, wherein the dielectric columns include diamond-like carbon.

22. The integrated circuit of claim 19, wherein the silicon-rich dielectric anti-reflective coating includes one or more materials selected from a group of materials including a silicon-rich oxide, a silicon-rich nitride, and a silicon-rich oxynitride.

23. The integrated circuit of claim 19, wherein the base dielectric includes tetraethyl orthosilicate disposed on a spin-out dielectric above a substrate.

* * * * *